US012631478B2

(12) United States Patent
Dwivedi et al.

(10) Patent No.: US 12,631,478 B2
(45) Date of Patent: May 19, 2026

(54) MOTOR DRIVE AND METHOD FOR MONITORING OPERATIONAL MEASUREMENT DATA OF A ELECTRIC MOTOR HAVING AT LEAST ONE OPERATING POINT

(71) Applicant: Danfoss Power Electronics A/S, Gråsten (DK)

(72) Inventors: Sanjeet Kumar Dwivedi, Gråsten (DK); Norbert Hanigovszki, Sønderborg (DK); Jörg Dannehl, Nordborg (DK)

(73) Assignee: DANFOSS POWER ELECTRONICS A/S, Gråsten (DK)

( * ) Notice: Subject to any disclaimer, the term of this patent is extended or adjusted under 35 U.S.C. 154(b) by 539 days.

(21) Appl. No.: 16/867,217

(22) Filed: May 5, 2020

(65) Prior Publication Data

US 2020/0355526 A1 Nov. 12, 2020

(30) Foreign Application Priority Data

May 8, 2019 (DE) .......................... 102019112019.5

(51) Int. Cl.
*G01D 21/02* (2006.01)
*G01R 31/34* (2020.01)
*G08B 21/18* (2006.01)

(52) U.S. Cl.
CPC ........... *G01D 21/02* (2013.01); *G01R 31/343* (2013.01); *G08B 21/18* (2013.01)

(58) Field of Classification Search
CPC ...... G01D 21/02; G01R 31/343; G08B 21/18; H02H 7/0833
See application file for complete search history.

(56) References Cited

U.S. PATENT DOCUMENTS 7,991,586 B2 8/2011 Silovic et al.
9,071,110 B2 6/2015 Lalonge et al.
(Continued)

FOREIGN PATENT DOCUMENTS

CN 111913105 A * 11/2020 ............. G01D 21/02
DE 102014107094 A1 12/2014

*Primary Examiner* — Yoshihisa Ishizuka
(74) *Attorney, Agent, or Firm* — McCormick, Paulding & Huber PLLC

(57) ABSTRACT

The invention relates to a motor drive for monitoring operational measurement data (34) of an electric motor (12) having at least one operating point (78, 80, 82, 84), wherein the electric motor (12) is configured to drive a load (21), the motor drive (10) comprising a measurement unit (14) for acquiring initial measurement data (118) for at least one of the operating points (78, 80, 82, 84) of the electric motor (12), wherein the initial measurement data comprises sensor data and/or estimated data; a processing unit (26) for determining a baseline (58, 60, 62, 64) from the initial measurement data (118) for the at least one operating point (78, 80, 82, 84); an output unit (28); characterized in that the processing unit (26) is configured to generate at least one threshold level (36, 38, 40) for the at least one determined baseline (58, 60, 62, 64), while the electric motor (12) is on an on state or an off state; wherein the at least one threshold level (36, 38, 40) defines a level of deviation from the determined baseline (58, 60, 62, 64), wherein the output unit (28) is configured to provide the at least one threshold level (36, 38, 40) resulting in conditions for monitoring the operational measurement data (34) of the electric motor (12). The invention provides an improved motor drive (10) for monitoring operational measurement data (34) of a electric motor (12) that are more accurate than in the prior art.

22 Claims, 4 Drawing Sheets

(56)          References Cited

U.S. PATENT DOCUMENTS

| 10,187,003 | B2 | | 1/2019 | Vinson et al. | |
|---|---|---|---|---|---|
| 2004/0085087 | A1 | * | 5/2004 | Zehentner | G01R 31/42 |
| | | | | | 324/765.01 |
| 2012/0330577 | A1 | * | 12/2012 | Kar | G01M 13/045 |
| | | | | | 702/56 |
| 2013/0345908 | A1 | * | 12/2013 | Dorr | G05B 23/0235 |
| | | | | | 701/4 |
| 2014/0354292 | A1 | | 12/2014 | Hiti et al. | |
| 2015/0100167 | A1 | * | 4/2015 | Sloo | G08B 25/012 |
| | | | | | 700/278 |
| 2018/0348303 | A1 | * | 12/2018 | Unnikrishnan | G01H 3/12 |
| 2019/0064034 | A1 | * | 2/2019 | Fayfield | G05B 23/027 |
| 2019/0101436 | A1 | * | 4/2019 | Li | H02P 29/0241 |
| 2019/0201030 | A1 | * | 7/2019 | Shelton, IV | A61B 5/065 |

* cited by examiner

MOTOR DRIVE AND METHOD FOR MONITORING OPERATIONAL MEASUREMENT DATA OF A ELECTRIC MOTOR HAVING AT LEAST ONE OPERATING POINT

CROSS-REFERENCE TO RELATED APPLICATION

This application claims foreign priority benefits under 35 U.S.C. § 119 to German Patent Application No. 102019112019.5 filed on May 8, 2019, the content of which is hereby incorporated by reference in its entirety.

TECHNICAL FIELD

The invention relates to a motor drive and a method for monitoring operational measurement data of an electric motor having at least one operating point.

BACKGROUND

Complex systems like electric motors comprise many parts such that those systems comprise many sources and levels of faults. An early detection and repair of those faults may lead to a longer uptime and lifetime of the system and reduces costs that are caused by shutdowns. For detecting faulty components, the systems comprise sensors that monitor those systems. The sensors acquire sensor data that indicate the state of the system.

From U.S. Pat. No. 7,991,586 B2, it is known to measure values of a pump or a drive motor. Those measured values are monitored and evaluated. Furthermore, the pump or drive motor comprises a memory, which stores technological data of the pump or the drive motor. Based on the measurement values and the technological data a microcomputer calculates operational data. A display shows the measured values and/or the calculated operational data. Furthermore, the display shows a "good" state, a warning state or an alarm state for the pump arrangement and may provide information about the operating points of the pump or the drive motor. However, the determination of the states for the pump arrangement is based on the technological data stored in the memory, which may be unsuitable for the actual operational point of the pump or drive motor.

SUMMARY

Thus, the technical object may be providing an improved motor drive and an improved method for monitoring operational measurement data of an electric motor that are more accurate than in the prior art.

Claims 1 and 13 indicate the main features of the invention. Features of embodiments of the invention are subject of claims 2 to 12 and 14 to 16.

In an aspect of the invention, a motor drive for monitoring operational measurement data of an electric motor having at least one operating point is provided, wherein the electric motor is configured to drive a load, the motor drive comprising a measurement unit for acquiring initial measurement data for at least one of the operating points of the electric motor, wherein the initial measurement data comprises sensor data and/or estimated data; a processing unit for determining a baseline from the initial measurement data for the at least one operating point; an output unit; wherein the processing unit is configured to generate at least one threshold level for the at least one determined baseline, while the electric motor is on an on state or an off state; wherein the at least one threshold level defines a level of deviation from the determined baseline, wherein the output unit is configured to provide the at least one threshold level resulting in conditions for monitoring the operational measurement data of the electric motor.

According to the invention, the motor drive generates at least one threshold level for a baseline from initial measurement data. The motor drive acquires the initial measurement data by initially operating the electric motor on at least one operating point. The initial operation may be a reference phase of the electric motor, wherein the reference phase is used for generating the initial measurement data. Alternatively, the initial operation may be the beginning of a normal operation phase of the electric motor. The generation of the threshold level is based on the initial measurement data that is acquired while operating the electric motor on at least one operating point. The initial measurement data for the at least one operating point is used for the determination of the baseline for a particular operating point. When operating the electric motor at different operating points, the motor drive generates a baseline for each operating point. At least one threshold level is determined for each baseline. More than one threshold levels have different deviations from the baseline. This means, that the threshold levels deviate from each other, too. Hence, in relation to the baseline, one of the threshold levels can be the lowest threshold level and another one can be the highest threshold level. Each further threshold level has a lower neighboring threshold level and a higher neighboring threshold level. The resulting threshold levels apply to specific operating points. The determined threshold levels reflect the probability of failure of the electric motor with high accuracy since they are based on the particular operating points of the electric motor. Furthermore, the motor drive further provides thresholds for further operating points of the electric motor, such that the corresponding threshold levels are applied for each operational point. This increases the accuracy of the motor drive for monitoring operational measurement data of an electric motor. Therefore, those threshold levels may be used as conditions for monitoring the electric motor. Furthermore, since at least two different threshold levels are set for each baseline, i.e. for each operating point of the electric motor, a threshold regime with increasing threshold levels may be provided. Each threshold level may indicate a different probability of failure such that the motor drive, the electric motor or a user may react depending on the threshold level, that is exceeded by the operational measurement data during operation of the electric motor. The threshold levels may also indicate which components of the electric motor comprise an increased failure probability.

The measurement data may for example be data about vibrations, load, flux, torque, current, stator windings, temperature, humidity, lifetime, and/or operating hours etc. Furthermore, the measurement data may comprise more than one kind of data, e.g. vibration data and flux data or load data, current data and vibration data. Thus, the motor drive provides baselines and threshold levels for combinations of several kinds of data for the at least one operational point.

In an example, the measurement unit may be configured to receive operational measurement data for an actual operating point of the electric motor, wherein the processing unit is further configured to determine the corresponding threshold levels that are exceeded by the operational measurement data corresponding to the actual operating point.

The processing unit of the motor drive may also be used to monitor the operational measurement data, which is acquired after the determination of the threshold levels. Thus, the processing unit may determine whether the operational measurement data exceeds the at least one threshold level for a specific operating point.

Furthermore, the processing unit may be configured to initially compare the operational measurement data with a lowest of the at least one threshold level, wherein the processing unit is further configured compare the operational measurement data with a further of the at least one threshold level if the operational measurement data exceeds all threshold levels being lower to the further of the at least one threshold level.

Thus, the processing unit first determines whether the operational measurement data for the actual operating point of the electric motor exceeds a lowest one of the at least one threshold level. If the operational measurement data exceeds the lowest threshold level, the processing units checks whether the operational measurement data exceeds the next threshold level.

The processing unit may further be configured to provide a monitoring signal indicating the number of threshold levels being exceeded by the operational measurement data, wherein the operational measurement data preferably comprises more than one measured signal and/or more than one estimated signals. The operational measurement data may be combinations of several measurement signals and/or estimated signals. The estimated signals are sensor-free data, which only estimate the monitored values.

The monitoring signal may be used to initiate maintenance processes for the electric motor. Depending on the number of exceeded threshold levels, the monitoring signal may induce different maintenance processes. The monitoring signal may be used for condition-based maintenance or predictive maintenance of the electric motor.

In a further example, the monitoring signal may be a warning signal if the measurement value exceeds one of at least two threshold levels, wherein the monitoring signal is an alarm signal if the operational measurement data exceeds every threshold level.

This provides a stepwise increase of the warning and/or alarm level. The monitoring signal will first indicate a warning if the operational measurement data exceed the first threshold level. The warning will intensify with the exceeding of further threshold levels. If the operational measurement data exceeds also the highest threshold level, the monitoring signal will be an alarm signal that indicates a severe fault of the electric motor.

Furthermore, the processing unit may be configured to provide the monitoring signal corresponding to the exceeding of a particular threshold level after a predetermined period depending on the number of exceeded threshold levels, wherein the higher the number of exceeded threshold levels the shorter the predetermined period.

The processing unit therefore waits for a predetermined period before providing the monitoring signal for a particular threshold level after the operational measurement data exceed a threshold level. If the later acquired operational measurement data does not exceed the particular threshold level during the predetermined period, the processing unit will not provide the monitoring signal for the particular threshold level. Furthermore, a counter of the predetermined period may be reset after the particular threshold level is not exceeded anymore. The reset of the counter may be delayed, checking whether the operational measurement data stays below the threshold level for a certain period. The high threshold levels have shorter predetermined periods. This means the waiting period for the processing unit to provide the monitoring signal for a particular threshold level is shorter for the high threshold levels than the predetermined period for the low threshold levels. Thus, severe faults are indicated quicker by the monitoring signal than non-severe faults.

The monitoring signal may also indicate a non-faulty state of the electric motor if the operational measurement data does not exceed any threshold level.

Furthermore, the processing unit may further be configured to provide at least one automatically or manually provided value as the at least one generated threshold level, wherein the at least one automatically or manually provided value preferably is a factory default value for the electric motor.

The measurement unit may also be configured to acquire at least a portion of the initial measurement data during a transition of the electric motor between two of the plurality of operating points.

Thus, the processing unit provides baselines and threshold levels for the transition phase between two operational points, too. If the electric motor transitions between two operating points, the motor drive may provide the corresponding threshold levels for the transition phase for the check whether the operational measurement data exceeds the threshold levels corresponding to the transition phase. This results in a continuous monitoring of the operation of the electric motor.

The at least one of operating points may be a speed profile of the electric motor.

The initial measurement data and the operational measurement data may comprise different kinds of data, wherein the kinds of data preferably comprise vibration data, load data, flux data, torque data, current data, and/or data from stator windings.

The measurement data may therefore be a combination of different kinds of data, which form a multidimensional pattern. This further increases the accuracy of the monitoring of the electric motor.

In an example, the measurement unit may be a frequency converter for driving the electric motor.

Thus, the frequency converter may be used a sensor for monitoring the state of the electric motor that the frequency converter drives.

In a further example, the at least the processing unit is connected to a further Cloud based device, wherein the processing unit is configured to receive at least one threshold level for the at least one determined baseline by the Cloud based device as the at least one generated threshold level, wherein the Cloud based device is configured to determine a baseline from the initial measurement data for the at least one operating point.

The Cloud based device may therefore determine the baseline and generate the threshold instead of the processing unit. The Cloud based device receives all required data for determining the baseline. From that baseline, the Cloud based device generates the threshold and provides the threshold the processing unit. The data transfer may be provided via wireless network or LAN network, for example.

Furthermore, the Cloud based device may receive the operational measurement data and check whether the operational data exceeds the at least one threshold.

In another aspect, a method for monitoring operational measurement data of an electric motor having at least one operating point is provided, the method comprising the following steps: acquiring initial measurement data for at least one of the operating points of the electric motor using a motor drive according to the preceding claims; receiving an operating point signal indicating the operating point of the electric motor; determining a baseline from the initial measurement data for each operating point; generating at least one threshold level for each determined baseline; wherein the at least one threshold level defines a level of deviation from the determined baseline; and providing the at least one threshold level resulting in conditions for monitoring the operational measurement data of the electric motor.

In an example, the method may further comprise the steps: receiving operational measurement data for an operating point of the electric motor and determining the threshold levels that are exceeded by the operational measurement data corresponding at the operating point.

Furthermore, the method further may comprise the step: providing a monitoring signal indicating the number of threshold levels being exceeded by the operational measurement data.

The effects and further embodiments of the method according to the present invention are analogous to the effects and embodiments of the motor drive according to the description mentioned above. Thus, it is referred to the above description of the motor drive.

The method may further comprise the step: initiating a maintenance process, based on the monitoring signal if the monitoring signal indicates that the measurement value exceeds at least one of the threshold levels.

Depending on the monitoring signal, an adapted maintenance may be provided to the electric motor. The maintenance may be performed by the electric motor, an external system and/or a user.

BRIEF DESCRIPTION OF THE DRAWINGS

Further features, details and advantages of the invention result from the wording of the claims as well as from the following description of exemplary embodiments based on the drawings. The figures show:

DETAILED DESCRIPTION

Figure 1A:
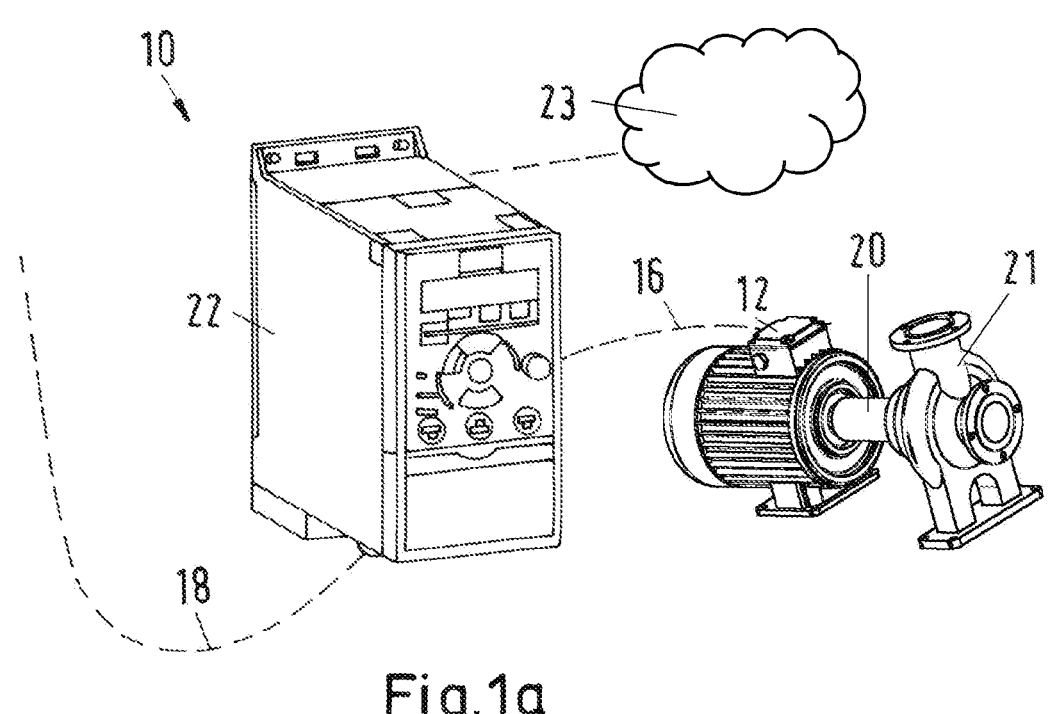
FIG. 1a, b schematic drawings of the motor drive for monitoring operational measurement data of the electric motor.

FIG. 1a shows the motor drive 10 for monitoring operational measurement data of the electric motor 12.

The motor drive 10 may comprise a frequency converter 22, which converts an incoming frequency from an input power line 18 to a variable output frequency for the electric motor 12. The output frequency is provided via the output line 16 to the electric motor 12. The electric motor 12 has a drive shaft 20, which may rotate at different speeds. The different speeds of the drive shaft 20 define different operating points of the electric motor 12. The drive shaft 20 is connected to a load 21 such that the electric motor 12 drives the load 21. The load 21 may be a customer application. For example, the load 21 may be a pump.

Figure 1B:
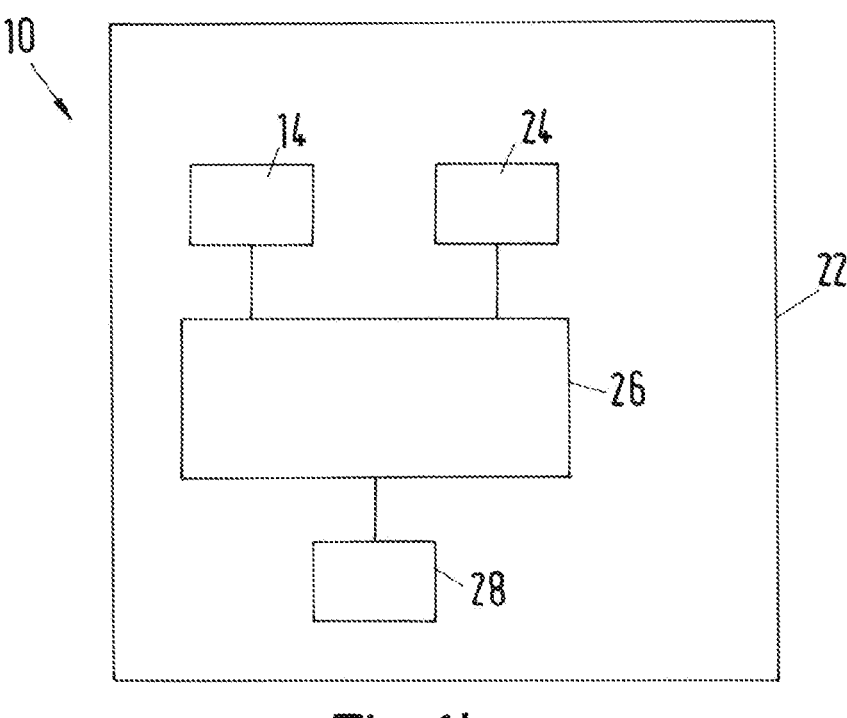

According to FIG. 1b, as part of the motor drive 10, the frequency converter 22 comprises a measurement unit 14, an input unit 24, a processing unit 26, and an output unit 28. In an example, the monitoring of the condition of the electric motor can also be based on the Cloud 23 shown in FIG. 1a, where data are stored, processed analyzed and decisions are made. The motor drive 10 can deliver measurement data to the Cloud 23 shown in FIG. 1a via a wireless network or via a LAN network.

The measurement unit 14 is configured to acquire measurement data for at least one operating point of the electric motor. The measurement data may be initial measurement data or operational measurement data of the electric motor. Initial measurement data may be acquired while the electric motor is operated in the reference phase to acquire reference data about the electric motor. When the electric motor is not in the reference phase, operational measurement data may be acquired.

The measurement data may be different kind of data. For example, the measurement data may be one or a combination of vibration data, load data, flux data, torque data, current data, and/or data from stator windings. Furthermore, the measurement data may be sensor data or estimated data.

The processing unit 26 is configured to determine a baseline from the initial measurement data for each operating point of the electric motor. Furthermore, the processing unit is configured to generate at least one threshold level for each determined baseline. The at least one threshold level defines a level of deviation from the determined baseline. The processing unit 26 may determine the baseline and generate the threshold independently of the on and off state of the electric motor.

The processing unit 26 is further configured to determine the threshold levels that are exceeded by the operational measurement data corresponding to the operating point of the electric motor. The processing unit 26 initially compares the operational measurement data with a lowest threshold level of the at least one threshold level. If the processing unit 26 finds that the operational measurement data exceed the lowest threshold level, the processing unit 26 compares the operational measurement data with the next lowest threshold level. Thus, the processing unit 26 is configured to compare the operational measurement data with a particular threshold level if the operational measurement data exceed all threshold levels being lower than that particular threshold level.

Furthermore, the processing unit 26 is configured to provide a monitoring signal. The monitoring signal indicates the number of threshold levels that are exceeded by the operational measurement data. If the operational measurement data exceeds the lowest threshold level, the monitoring signal may be a warning signal. The warning level of the warning signal may rise if the operational measurement data exceed further threshold levels. If the operational measurement data exceed all threshold levels, the monitoring signal may be an alarm signal.

Before providing the monitoring signal indicating the exceeding of a particular threshold level, the processing unit 26 is configured to wait for predetermined period. If the operational measurement data still exceeds the particular threshold level after the predetermined period, the processing unit 26 provides the monitoring signal for that particular threshold level. If the operational measurement data does not exceed the particular threshold level after the predetermined period anymore, the processing unit 26 may wait for a cool down time before refraining from providing the monitoring signal for that particular threshold level and resetting the predetermined period. If the operational measurement data exceeds the threshold level again during the cool down time, the processing unit 26 continues waiting for the predetermined period of the previous exceeding of the threshold level.

The higher the threshold level, the shorter the predetermined period in which the processing unit 26 waits whether the operational measurement data stays above the threshold level or not.

The output unit 28 is configured to provide the at least one threshold level. The at least one threshold levels may be stored in a memory (not shown) of the frequency converter or a Cloud based memory and used later on as conditions for monitoring the operational measurement data of the electric motor.

FIGS. 2a to 2d show different diagrams that are used to explain how the processing unit determines the threshold levels from the initial measurement data.

Figure 2A:
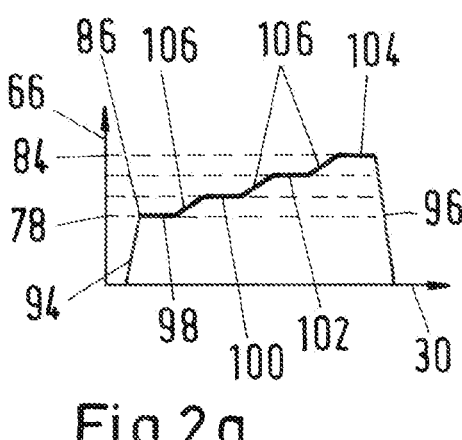
FIG. 2a-d schematic diagrams showing the relation between the initial measurement data and the threshold levels.

According to FIG. 2a, a diagram is shown providing the speed 66 of the drive shaft of the electric motor versus the time 30. Different speed profiles correspond to different operating points. In an initial phase, the curve comprises a ramp 94 in which the speed 66 is increased to a first operating point 78. Then, the speed 66 stays constant. At this starting point 86, the sampling of the initial measurement data is started. The initial measurement data may be fault detection data.

The acquisition of the initial measurement data starts with a first plateau phase 98. After the first plateau phase 98, the speed 66 is slowly ramped up in a transition phase 106 to a further operating point. A second plateau phase 100 starts in which the speed 66 stays constant. In the end of the plateau phase 100 a further transition phase 106 is started in which the speed 66 is ramped up, slowly. When the speed 66 reaches a third operating point, a third plateau phase 102 starts. After further transition phase 106 a fourth plateau phase 104 begins which corresponds to a last operating point 84. In the end of the plateau phase 104 a ramp down phase 96 is started in which the speed 66 is ramped down.

Figure 2B:
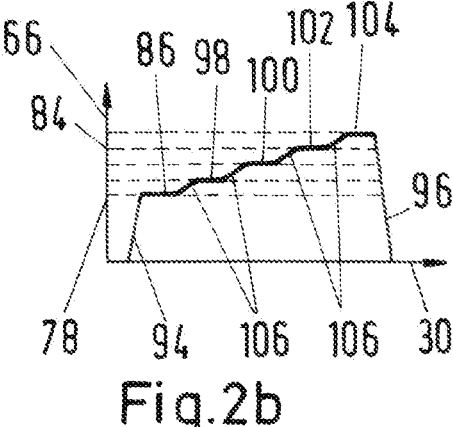

FIG. 2b shows a diagram with the same elements as the diagram of FIG. 2a. Same reference numbers denote same elements such that it is referred to the description of FIG. 2a. The diagram of FIG. 2b and the diagram of FIG. 2a differ in the starting point 86 of the sampling of the initial measurement data. In FIG. 2b the starting point 86 is in the beginning of a transition phase 106, wherein in FIG. 2a the starting point 86 is in the beginning of a plateau phase. Thus, in FIG. 2b, the sampling of the initial measurement data starts with a transition phase 106 and not with a plateau phase 98 as in FIG. 2a.

Figure 2C:
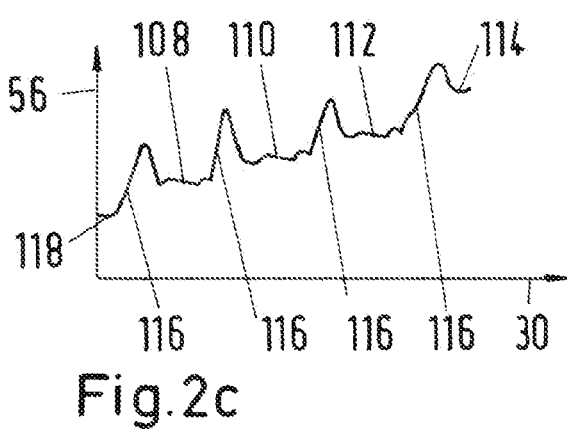

The diagram in FIG. 2c shows a fault signature 56 versus time 30. The fault signature 56 may for example be based on the vibration as initial measurement data 118 that is measured by the measuring unit. The curve of the diagram shows the initial measurement data 118. The transition phases 106 of FIGS. 2a and 2b correspond to the sections 116 in FIG. 2c. Plateau phases 98, 100, 102, and 104 of FIGS. 2a and 2b correspond to the sections 108, 110, 112, and 114 of FIG. 2c, respectively.

Figure 2D:
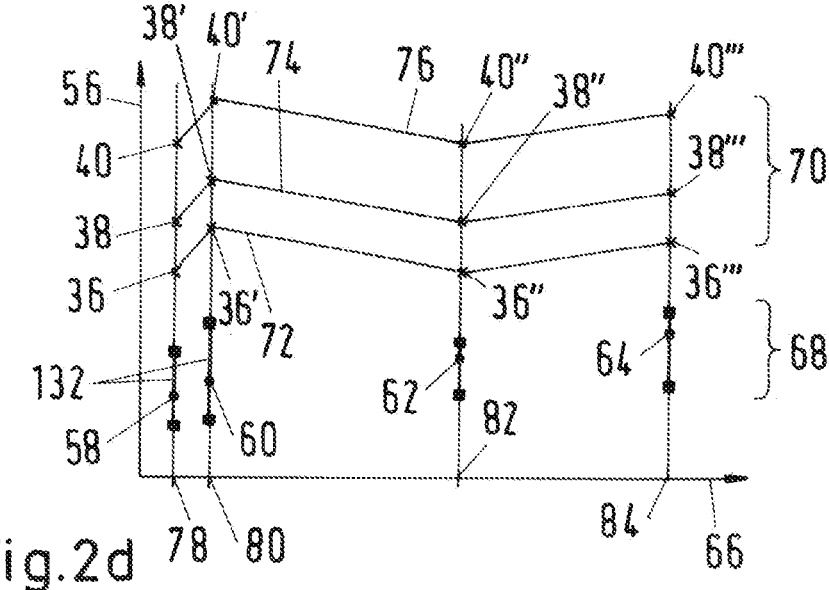

The diagram of FIG. 2d shows the fault signature 56 versus the speed 66. The axis of speed 66 denotes the operating points 78, 80, 82, and 84. The processing unit uses the initial measurement 118 of FIG. 2c to determine baselines 68 for each operating point 78, 80, 82, and 84. For example, the baseline 58 corresponds to operating point 78, the baseline 60 corresponds to operating point 80, the baseline 62 corresponds to operating point 82, and the baseline 64 corresponds to operating point 84.

The baseline 58, 60, 62, and 64 may comprise some error 132, which indicates a region in which the corresponding baseline 58, 56, 62, and 64 may also be located with a particular probability.

For each operating point 78, 80, 82, and 84, the processing unit generates at least one threshold level 70. According to FIG. 2d, the processing unit generates three threshold levels 70. Operating point 78 comprises the threshold levels 36, 38, and 40. Operating point 80 comprises the threshold levels 36', 38', and 40'. Operating point 82 comprises the threshold levels 36", 38", and 40". Operating point 84 comprises the threshold levels 36''', 38''', and 40'''.

The processing unit further interpolates each threshold level between the operating points. For example, the threshold levels 36, 36', 36", and 36''' are connected via line 72 to provide threshold levels for the operating points of the electric motor between the denoted operating points 78, 80, 82, 84. Line 74 connects the threshold levels 38, 38', 38", and 38''', and line 76 connects the threshold levels 40, 40', 40", and 40'''.

Figure 3:
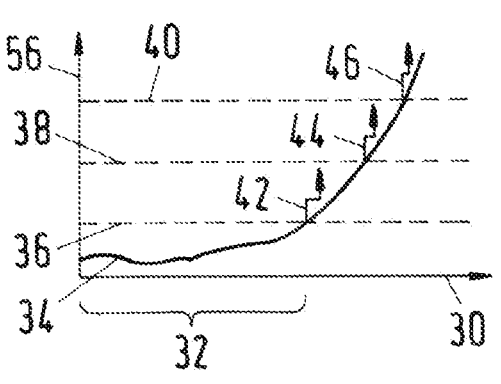
FIG. 3 a schematic diagram showing the use of the threshold levels for the operational measurement data.
Figure 3:
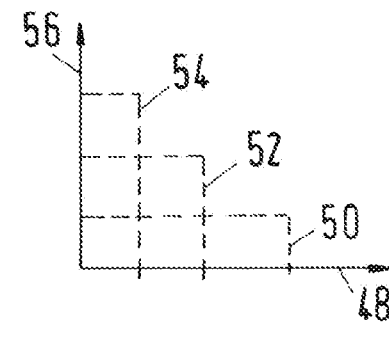

FIG. 3 shows two diagrams. The diagram on the left side shows the fault signature 56 versus time 30 comprising the operational measurement data 34. The diagram on the right side shows the fault signature 56 versus a delay time 48. Both diagrams comprise of the threshold levels 36, 38, and 40.

During a period 32, the operational measurement data 34 in the left diagram stays below the lowest threshold level 36. After that period 32, the operational measurement data 34 exceeds the threshold level 36. The processing unit detects the point of time at which the operational measurement data 34 exceeds the threshold level 36 and initiates the transmission of a monitoring signal that is a warning signal 42. Before sending the warning signal 42, the processing unit waits for a predetermined period 50, which is shown in the right diagram. The processing unit checks whether the operational measurement data 34 stays above the lowest threshold level 36 during that period 50. If the operational measurement data 34 still exceeds the lowest threshold level 36, the processing unit transmits the warning signal 42. If the operational measurement data 34 falls below the lowest threshold level 36, the processing unit waits for further predetermined period before resetting a time counter for the predetermined period 50. If the operational measurement data 34 is still below the threshold level 36 after the further predetermined period, the processing unit resets the predetermined period 50. If not, the processing unit continues to wait the predetermined period 50 and sends the monitoring single after the predetermined period 50.

If the operational measurement data 34 exceeds the further threshold level 38 after exceeding the lowest threshold level 36, the processing unit waits for further predetermined period 52 which is shorter than the predetermined period 50 before transmitting a further warning signal 44. During the predetermined period 52, the processing unit checks whether the operational measurement data 34 falls below the threshold level 38 or not. If the operational measurement data 34 is still above the threshold level 38, the processing unit will transmit the further warning signal 44 as a monitoring signal. If the operational measurement data 34 falls below the threshold level 38, the processing unit waits for a further predetermined period before resetting a counter for the predetermined period 52. If the operational measurement data 34 is still below the threshold level 38 after the further predetermined period, the processing unit resets the predetermined period 52. If not, the processing unit continues to wait the predetermined period 52 and sends the monitoring signal after the predetermined period 52. The further warning signal 44 provides a high level of warning than the warning signal 42.

If the operational measurement data 34 exceeds the highest threshold level 40 after exceeding the threshold levels 36 and 38, the processing unit waits for the last predetermined period 54 with is shorter than the predetermined period 52 before transmitting an alarm signal 46. During the predetermined period 54, the processing unit checks whether the operational measurement data 34 falls below the threshold level 40 or not. If the operational measurement data 34 is still above the threshold level 40, the processing unit will transmit the alarm signal 46 as a monitoring signal. If the operational measurement data 34 falls below the threshold level 40, the processing unit waits for a further predetermined period before resetting a counter for the predetermined period 54. If the operational measurement data 34 is still below the threshold level 40 after the further predetermined period, the processing unit resets the predetermined period 54. If not, the processing unit continues to wait the predetermined period 54 and sends the monitoring single after the predetermined period 54. The alarm signal 46 shell alert the system or a user that the electric motor comprises a severe fault which may cause damage and a soon failure.

Figure 4:
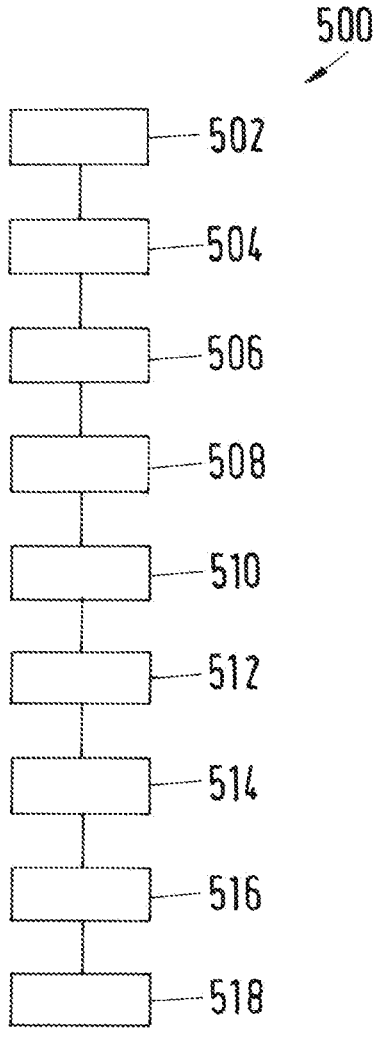
FIG. 4 a flowchart of the method for monitoring operational measurement data of the electric motor.

FIG. 4 shows a flowchart of a method 500 for monitoring operational measurement data of the electric motor having at least one operating point.

In a first step 502, initial measurement data for at least one of the operating points of the electric motor is acquired by a motor drive for monitoring operational measurement data of the electric motor as described above. A measurement unit of the motor drive may acquire the initial measurement data. Furthermore, the initial measurement data may be one or a combination of the group of vibration data, load data, flux data, torque data, current data, data from stator windings, temperature, humidity, lifetime, and/or operating hours data, etc.

In the further step 504, and operating point signal indicating the operating point of the electric motor is received. An input unit of the motor drive may receive the operating point signal. Furthermore, the operating point may be a speed profile of the electric motor.

In a step 506, a baseline may be determined from the initial measurement data for each operating point. A processing unit of the motor drive may perform this step, wherein the processing unit receives the initial measurement data from the input unit.

In a step 508, at least one threshold level for each determined baseline may be generated. In addition, the processing unit may perform that step. Furthermore, the at least one threshold level defines a level of deviation from the determined baseline.

In step 510, the at least one threshold level is provided as conditions for monitoring the electric motor. The threshold levels may be used to check whether operational measurement data indicates faults of the electric motor.

In step 512, operational measurement data for an operating point of the electric motor may be received. The measurement unit of the motor drive may perform this step.

In step 514, the threshold levels that are exceeded by the operational measurement data corresponding to the operating point are determined. This means, it is checked whether the operational measurement data exceeds a particular threshold level. The processing unit may perform that step.

In a further step 516, a monitoring signal indicating the number of threshold levels being exceeded by the operational measurement data is provided. The monitoring signal may be a warning signal or an alarm signal. A warning signal is provided, if the operational measurement data exceeds a threshold level, which is lower than the highest threshold level. If the operational measurement data exceeds the highest threshold level, the alarm signal is provided. The processing unit may perform that step.

In a step 518, a maintenance process based on the monitoring signal may be initiated. The monitoring signal indicates that the operational measurement value exceeds at least one of the threshold levels. The electric motor, and external system, and/or a user may perform the maintenance. The processing unit may also perform step 518.

Figure 5:
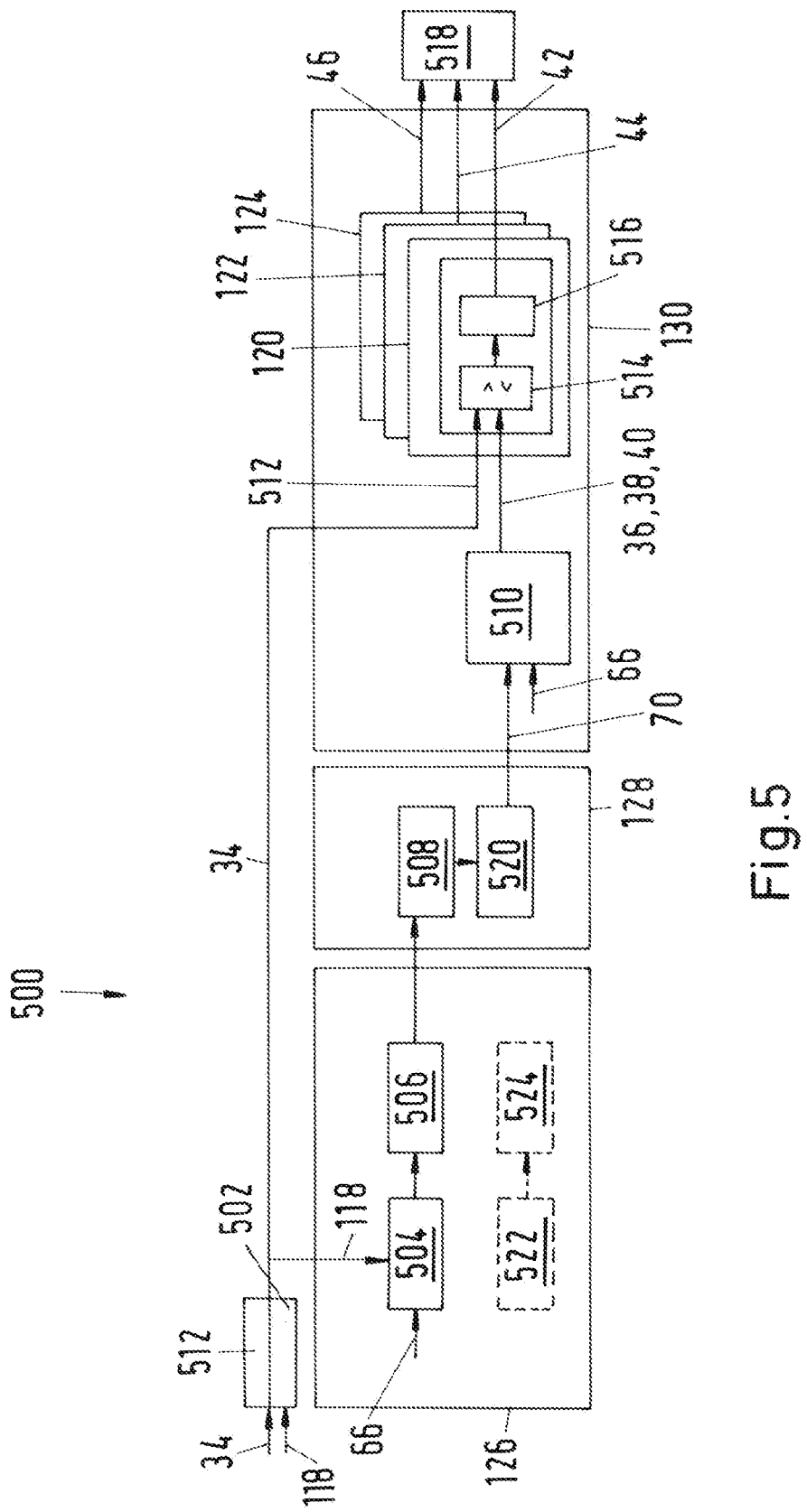
FIG. 5 a flowchart of an embodiment of the method.

FIG. 5 shows a flowchart with a specific embodiment of the method 500. Same reference numbers denote same elements of the method 500.

The flowchart comprises a baselining component 126, a threshold component 128 and a monitoring component 130.

The method steps being performed by the measurement unit are shown as steps 502 and 512. The operational measurement data 34 and the initial measurement data 118 are indicated as arrows.

In the baselining component 126, the speed 66 as operating point is received in step 504. Furthermore, the initial measurement data 118 is received so that further steps may use the initial measurement data 118. In step 506 baseline is determined from the initial measurement data for each operating point. Furthermore, in an optional step 522, a speed profile may be generated. That speed profile may be provided to the motor control of the electric motor in a further optional step 524 to get speed 66 data as operating points for the electric motor.

In the threshold component 128, after the calculation of the thresholds in step 508, the threshold levels and the operating points of the drive unit may be stored in a memory in step 520 as a threshold array.

In the monitoring component 130, the threshold arrays the speed 66 as operating point may be received in step 510 to provide the at least one threshold level as conditions for monitoring the operational measurement data of the electric motor. Furthermore, in the step 512, the operational measurement data 34 for operating point of the electric motor may be received. The threshold levels 36, 38, and 40 are provided and received in step 514. Step 514 determines whether the operational threshold measurement data exceed threshold levels for the corresponding operating point.

If the operational measurement data exceeds one of the threshold levels 36, 38, and 40, in step 516 a monitoring signal is provided indicating the number of threshold levels being exceeded. The provided monitoring signal may trigger a maintenance in step 518.

The invention is not limited to one of the aforementioned embodiments. It can be modified in many ways.

All features and advantages resulting from the claims, the description and the drawing, including constructive details, spatial arrangements and procedural steps, may be essential for the invention both in themselves and in various combinations.

What is claimed is:

1. A motor drive for monitoring operational measurement data of an electric motor having at least one operating point, wherein the electric motor is configured to drive a load, the motor drive comprising:

a measurement unit for acquiring initial measurement data for the at least one operating point of the electric motor, wherein the initial measurement data comprises sensor data and/or estimated data;

a processing unit for determining a baseline from the initial measurement data for the at least one operating point;

an output unit;

wherein the processing unit is configured to generate at least one threshold level for the at least one determined baseline, while the electric motor is in an on state or an off state;

wherein the at least one threshold level defines a level of deviation from the determined baseline, wherein the output unit is configured to provide the at least one threshold level resulting in conditions for monitoring the operational measurement data of the electric motor, wherein the motor drive is configured to receive an incoming frequency from an input line and provide an output frequency to the electric motor via an output line, and wherein the motor drive is configured to drive the electric motor through the output frequency provided to the electric motor.

2. The motor drive according to claim 1, wherein the measurement unit is configured to receive operational measurement data for an operating point of the at least one operating point of the electric motor, wherein the processing unit is further configured to determine the threshold levels that are exceeded by the operational measurement data corresponding to the operating point.

3. The motor drive according to claim 2, wherein the processing unit is further configured to provide a monitoring signal indicating the number of threshold levels being exceeded by the operational measurement data.

4. The motor drive according to claim 3, wherein the at least one threshold level comprises at least two threshold levels, wherein the monitoring signal is a warning signal if the operational measurement data exceeds one threshold level of the at least one threshold level, and wherein the monitoring signal is an alarm signal if the operational measurement data exceeds all threshold levels of the at least one threshold level.

5. The motor drive according to claim 3, wherein the operational measurement data comprises more than one measured signal and/or more than one estimated signals.

6. The motor drive according to claim 2, wherein the processing unit is further configured to provide at least one automatically or manually provided value as the at least one generated threshold level, and wherein the at least one automatically or manually provided value is a factory default value for the electric motor.

7. The motor drive according to claim 1, wherein the processing unit is further configured to provide at least one automatically or manually provided value as the at least one generated threshold level.

8. The motor drive according to claim 7, wherein the at least one automatically or manually provided value is a factory default value for the electric motor.

9. The motor drive according to claim 1, wherein the at least one operating point comprises a plurality of operating points, wherein the measurement unit is configured to acquire at least a portion of the initial measurement data during a transition of the electric motor between two of the plurality of operating points.

10. The motor drive according to claim 1, wherein the at least one operating point comprises a speed profile of the electric motor.

11. The motor drive according to claim 1, wherein the initial measurement data and the operational measurement data comprises one or more of vibration data, load data, flux data, torque data, current data, data from stator windings, temperature data, humidity data, lifetime data, and operating hours data.

12. The motor drive according to claim 1, wherein the measurement unit is a frequency converter for driving the electric motor.

13. The motor drive according to claim 1, wherein at least the processing unit is connected to a further Cloud based device, wherein the processing unit is configured to receive at least one threshold level for the at least one determined baseline by the Cloud based device as the at least one generated threshold level, wherein the Cloud based device is configured to determine a baseline from the initial measurement data for the at least one operating point.

14. The motor drive according to claim 1, wherein the at least one threshold level comprises a first threshold level and a second threshold level.

15. The motor drive according to claim 14, wherein the first threshold level indicates a first probability of failure of the motor drive and the second threshold level indicates a second probability of failure of the motor drive, and wherein the first probability of failure is different than the second probability of failure.

16. A method for monitoring operational measurement data of an electric motor having at least one operating point, the method comprising the following steps:

acquiring initial measurement data for the at least one of the operating point of the electric motor using a motor drive;

receiving an operating point signal indicating the operating point of the electric motor;

determining a baseline from the initial measurement data for each operating point;

generating at least one threshold level for the determined baseline; wherein the at least one threshold level defines a level of deviation from the determined baseline; and providing the at least one threshold level resulting in conditions for monitoring the operational measurement data of the electric motor;

wherein the motor drive comprises:

a measurement unit for acquiring initial measurement data for at least one of the operating points of the at least one operating point of the electric motor, wherein the initial measurement data comprises sensor data and/or estimated data;

a processing unit for determining a baseline from the initial measurement data for the at least one operating point;

an output unit;

wherein the processing unit is configured to generate at least one threshold level for the at least one determined baseline, while the electric motor is in an on state or an off state;

wherein the at least one threshold level defines a level of deviation from the determined baseline, wherein the output unit is configured to provide the at least one threshold level resulting in conditions for monitoring the operational measurement data of the electric motor, wherein the motor drive is configured to receive an incoming frequency from an input line and provide an output frequency to the electric motor via an output line, and wherein the motor drive is configured to drive the electric motor through the output frequency provided to the electric motor.

17. The method according to claim 16, wherein the method further comprises the steps:

receiving operational measurement data for an operating point of the at least one operating point of the electric motor, and determining the threshold levels that are exceeded by the operational measurement data corresponding to the operating point.

18. The method according to claim 17, wherein the method further comprises the step:

providing a monitoring signal indicating the number of threshold levels being exceeded by the operational measurement data.

19. The method according to claim 18, wherein the method further comprises the step:

initiating a maintenance process based on the monitoring signal if the monitoring signal indicates that the operational measurement value exceeds at least one of the threshold levels.

20. The method according to claim 16, wherein the generating the at least one threshold level for the determined baseline comprises generating a first threshold level and a second threshold level, wherein the first threshold level indicates a first probability of failure of the motor drive and the second threshold level indicates a second probability of failure of the motor drive, and wherein the first probability of failure is different than the second probability of failure.

21. A motor drive for driving an electric motor and for monitoring operational measurement data of the electric motor, the motor drive comprising:

a measurement unit for acquiring initial measurement data for at least one operating point of the electric motor, wherein the initial measurement data comprises sensor data and/or estimated data;

a processing unit for determining a baseline from the initial measurement data for the at least one operating point;

an output unit; and an enclosure;

wherein the processing unit is configured to generate at least one threshold level for the at least one determined baseline independent of the electric motor being in an on state or an off state;

wherein the at least one threshold level defines a level of deviation from the determined baseline;

wherein the output unit is configured to provide the at least one threshold level resulting in conditions for monitoring the operational measurement data of the electric motor;

wherein the motor drive is configured to receive an incoming frequency from an input line and provide an output frequency to the electric motor via an output line;

wherein the motor drive is configured to drive the electric motor through the output frequency provided to the electric motor; and wherein the measurement unit, the processing unit, and the output unit are arranged within the enclosure, and the enclosure encloses motor drive elements that receive the incoming frequency from the input line and provide the output frequency to the electric motor via the output line in order to drive the electric motor.

22. The motor drive according to claim 21, wherein the processing unit is configured to transmit an alarm signal indicating a severe fault in the electric motor that may cause damage and a soon failure when the processing unit determines that the operational measurement data exceeds a highest threshold level of the at least one threshold level.

\* \* \* \* \*